United States Patent
Han

(10) Patent No.: US 9,193,145 B2
(45) Date of Patent: Nov. 24, 2015

(54) SCREEN MASK

(71) Applicant: Samsung Display Co., Ltd., Yongin, Gyeonggi-do (KR)

(72) Inventor: Jeong-Won Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/961,776

(22) Filed: Aug. 7, 2013

(65) Prior Publication Data

US 2014/0165863 A1    Jun. 19, 2014

(30) Foreign Application Priority Data

Dec. 17, 2012    (KR) .......................... 10-2012-0147541

(51) Int. Cl.

| | | |
|---|---|---|
| B05C 17/06 | (2006.01) | |
| B05C 17/08 | (2006.01) | |
| B41F 15/36 | (2006.01) | |
| B41F 15/34 | (2006.01) | |
| B41F 15/18 | (2006.01) | |
| H05K 3/12 | (2006.01) | |
| B41L 13/02 | (2006.01) | |
| B41F 15/08 | (2006.01) | |

(52) U.S. Cl.
CPC ............. *B41F 15/36* (2013.01); *B41F 15/0881* (2013.01); *B41F 15/18* (2013.01); *B41F 15/34* (2013.01); *B41L 13/02* (2013.01); *H05K 3/1216* (2013.01); *H05K 3/1225* (2013.01)

(58) Field of Classification Search
CPC .......... B41F 15/34; B41F 15/36; B41F 15/18; B41F 13/02; B41F 15/0813; B41F 15/0845; B41F 15/0881; H05K 3/1225

USPC .............. 101/114, 123, 124, 126, 127, 127.1, 101/128, 128.1, 129; 38/102, 102.1, 102.8, 38/102.9; 160/378–381
See application file for complete search history.

(56) References Cited

U.S. PATENT DOCUMENTS

| | | | | |
|---|---|---|---|---|
| 1,892,268 | A  * | 12/1932 | Flockhart ................... | 101/415.1 |
| 4,462,174 | A  * | 7/1984 | Messerschmitt ............. | 38/102.1 |
| 6,012,388 | A  * | 1/2000 | Shirakawa et al. ......... | 101/127.1 |
| 6,878,208 | B2 * | 4/2005 | Abiko ........................... | 118/720 |
| 2007/0084362 | A1* | 4/2007 | Kim et al. ..................... | 101/123 |

FOREIGN PATENT DOCUMENTS

| | | |
|---|---|---|
| JP | 2011-189670 | 9/2011 |
| KR | 10-0301738 | 10/2001 |
| KR | 2002-0066612 | 8/2002 |
| KR | 2002-0072869 | 9/2002 |
| KR | 10-0383042 | 5/2003 |

OTHER PUBLICATIONS

English Korean Abstract No. KR20020066612 A, dated Aug. 21, 2002, for corresponding Korean No. 10-0383042, 1 page.

* cited by examiner

*Primary Examiner* — Blake A Tankersley
*Assistant Examiner* — Marissa Ferguson Samreth
(74) *Attorney, Agent, or Firm* — Christie, Parker & Hale, LLP

(57) ABSTRACT

A screen mask for screen printing includes a mask, and a frame configured to support the mask with a tension; the frame including a fixing frame and a moving frame configured to support the mask and movably mounted on the fixing frame, wherein the tension is controlled by the moving frame.

10 Claims, 5 Drawing Sheets

SCREEN MASK

CROSS-REFERENCE TO RELATED APPLICATION

This application claims priority to and the benefit of Korean Patent Application No. 10-2012-0147541 filed in the Korean Intellectual Property Office on Dec. 17, 2012, the entire contents of which are incorporated herein by reference.

BACKGROUND (a) Field

The present invention relates to a screen mask for a screen printer.

(b) Description of the Related Art

A flat panel display is manufactured, in part, by forming a function layer for performing various functions on a substrate.

The function layer is manufactured through a thin-film process and a thick-film process, and a thick film may be formed by a screen printing process, a sandblast process, or a dry film process.

The screen printing process has good production efficiency and low processing cost, so it is widely used when high precision is not needed.

To form a fine pattern using the screen printing process, a mask with the same pattern as a pattern to be formed on the substrate is arranged on the substrate, and a source material is printed according to the pattern on the substrate, thereby forming a desired pattern.

After the mask is initially manufactured, a necessary amount of the mask is cut and it is attached or assembled to a mask frame to be used for the screen printing process.

In general, the mask frame to which the mask is attached is manufactured to be a high-precision, fixed body.

Therefore, when the mask is attached to the mask frame, it is generally impossible to increase or decrease the tensile force applied to the mask. If the mask is erroneously attached to the mask frame, the used mask is either detached from the mask frame and attached again thereto or the mask is discarded. Further, the size, uniformity, and position of an opening in the mask can be changed during the screen printing process, requiring the mask be reattached to the mask frame or discarded.

FIG. 5 shows a top plan view of a conventional screen mask used to print a screen. Here, the screen mask 1 includes a mask 3 on which a pattern is formed and a frame 2 to which the mask 3 is attached and supported by, and the tensile force is typically not added to or subtracted from the mask 3 once it is attached to the frame 2.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a screen mask with precisely controllable tension and for controlling tension in at least two directions.

An exemplary embodiment of the present invention provides a screen mask for screen printing including a mask and a frame configured to support the mask with a tension, the frame including a fixing frame and a moving frame configured to support the mask and movably mounted on the fixing frame, wherein the tension is controlled by the moving frame.

A plurality of moving frames may support an edge of the mask.

Each of the plurality of moving frames may be movable in at least two directions.

Each of the plurality of moving frames may be movable in two directions that are perpendicular to each other and on a plane that is parallel with the mask.

The mask may have a rectangular shape, and each of the plurality of moving frames may be movable in directions that are parallel to two adjacent sides of the mask.

The moving frame includes a first rail installed at the fixing frame, a first carriage movable along the first rail and including a second rail perpendicular to the first rail, and a second carriage movable along the second rail and supporting one side of the mask.

The first carriage may be mounted on the first rail, and the second carriage may be mounted on the second rail, the second rail being at the top of the first carriage.

The first carriage and the second carriage may be moved by a ball screw.

The ball screw may be configured to be driven by a driving motor.

The ball screw may be configured to be driven manually.

According to embodiments of the present invention, a plurality of moving frames configured to support the mask are movable in at least two directions, thereby precisely controlling the tension of the mask.

The tension supporting the mask is precisely controllable, thereby reducing or preventing undesired reinstallation and/or replacement of the mask. Additional aspects and/or features of the invention will be set forth in part in the description which follows and, in part, will be obvious from the description or may be learned by practice of the invention.

DETAILED DESCRIPTION

Figure 1:
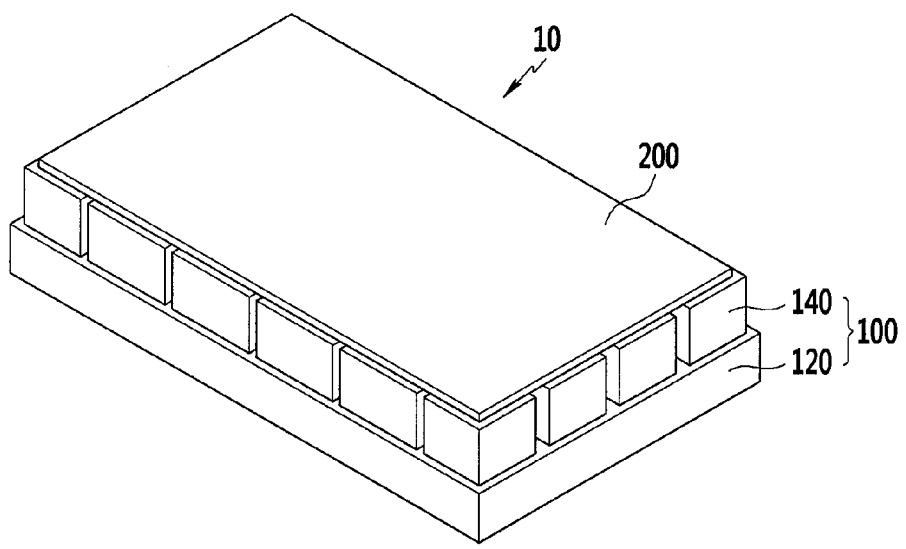
FIG. 1 shows a perspective view of a screen mask according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of each configuration shown in the drawings are arbitrarily shown for understanding and ease of description, but the present invention is not limited thereto.

Figure 2:
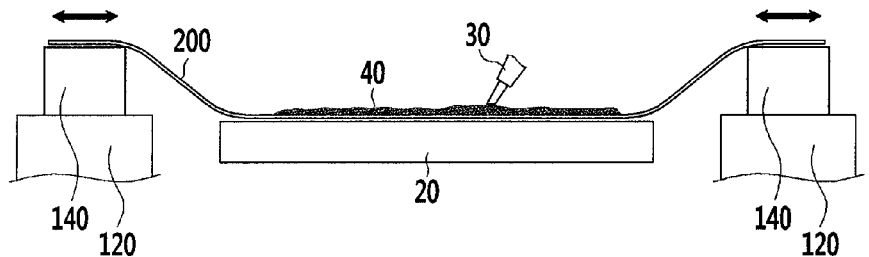
FIG. 2 shows a screen printing process using a screen mask according to an exemplary embodiment of the present invention.
Figure 3:
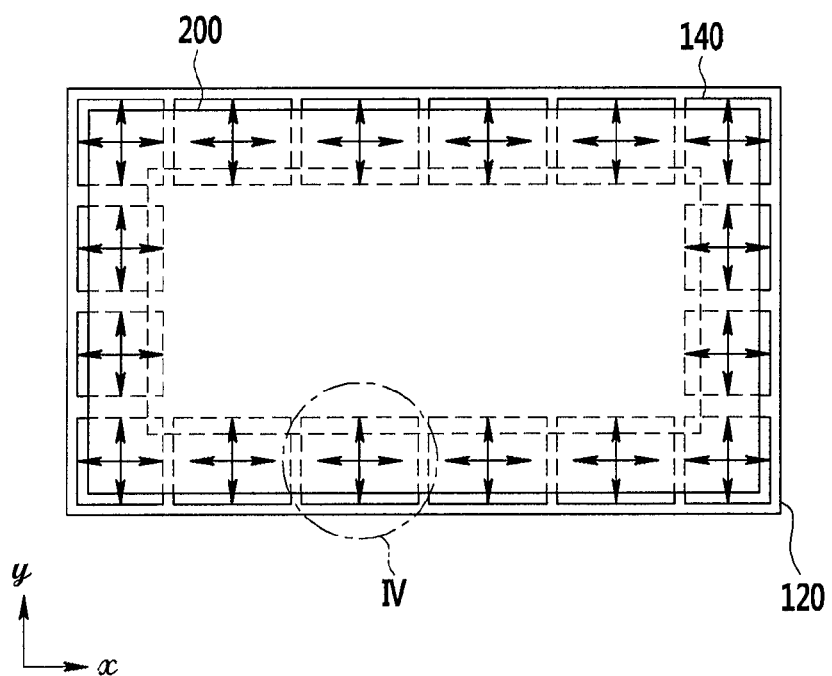
FIG. 3 shows a top plan view of a screen mask according to an exemplary embodiment of the present invention.
Figure 4:
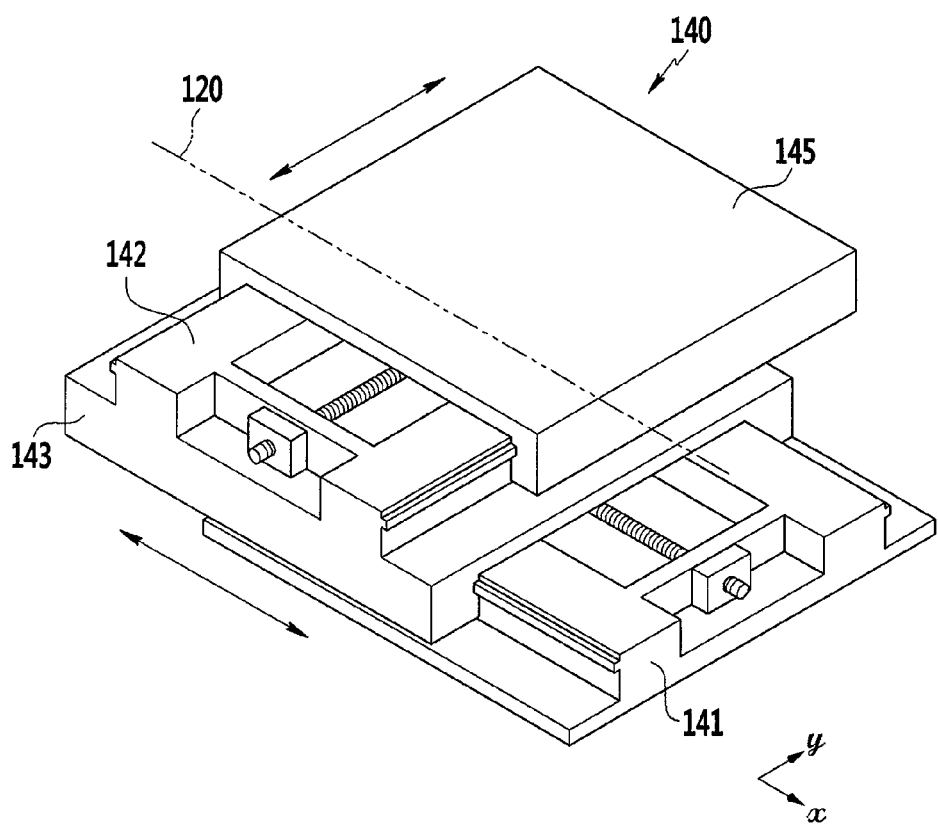
FIG. 4 shows an enlarged view of a part IV shown in FIG. 3.
Figure 5:
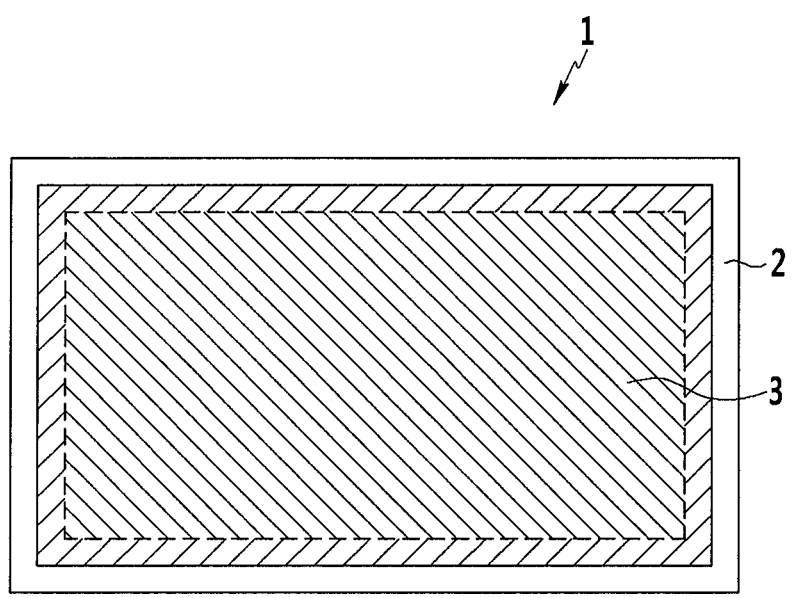
FIG. 5 shows a top plan view of a conventional screen mask.

FIG. 1 shows a perspective view of a screen mask according to an exemplary embodiment of the present invention. FIG. 2 shows a screen printing process using a screen mask according to an exemplary embodiment of the present invention. FIG. 3 shows a top plan view of a screen mask according to an exemplary embodiment of the present invention. FIG. 4 shows an enlarged view of a part IV shown in FIG. 3.

Referring to FIG. 1, the screen mask 10 according to an exemplary embodiment of the present invention is used for a screen printing process and includes a mask 200 and a frame 100.

The mask 200 is a printing mask on which a pattern to be printed on a substrate 20 of a display device is formed, and, according to an exemplary embodiment of the present invention, the mask 200 can be configured by coating a mesh member (or a plurality of mesh members) with a specific emulsion and forming an opening (or a plurality of openings) that corresponds to the pattern to be printed.

The mesh member (or a plurality of mesh members) may be formed of metal.

The mask 200 can be supported by the frame 100 with a tension (e.g., a predetermined tension).

Referring to FIG. 2, the mask 200 supported with the tension by the frame 100 is provided on the substrate 20, on which the pattern is formed. A printing material 40 is deposited on (e.g., supplied to) the mask 200 using a pressurizing apparatus 30 (e.g., nozzle) so that the printing material 40 may be passed through the opening (or openings) (not shown) formed in the mask 200, and the pattern may be printed on the substrate 20.

In an embodiment and as shown with arrows in FIG. 2, the screen mask 10 can control the tension supporting the mask 200 because frames 120 and 140 supporting the mask 200 are configured to be movable. The frame 100 for (e.g., configured for) supporting the mask 200 will now be described in detail.

As described, the frame 100 supports the mask 200 with a tension (e.g., a predetermined tension).

In one embodiment, the frame 100 includes a fixing frame 120 and a moving frame 140 so as to control the tension that supports the mask 200.

The fixing frame 120 supports the moving frame 140, and it can be formed to be a quadrangle and can be made of a rigid material, such as metal.

However, without being restricted to the quadrangle form and the metallic material, the fixing frame 120 can be formed to have various shapes and/or with various materials.

The moving frame 140 supporting the mask 200 can be movably installed (e.g., mounted) on the fixing frame 120.

In this embodiment, the moving frame 140 can fix and support an edge of the mask 200.

Accordingly, the tension of the mask 200 fixed to the moving frame 140 can be controlled (e.g., adjusted) by moving the moving frame 140.

The edge of the mask 200 can be attached to the moving frame 140 through a fastening apparatus or method (e.g., predetermined fastening apparatus or method) (not shown).

Here, the fastening apparatus or method can be a known fastening member, such as a bolt, or it can be a weld (e.g., configured through welding).

However, without being restricted to this, the fastening apparatus or method can be configured in various ways allowing the edge of the mask 200 to be attached to the moving frame 140.

There can be multiple (e.g., a plurality of) moving frames 140.

As shown in FIG. 1 and FIG. 3, a plurality of moving frames 140 can be installed in (e.g., mounted on) the fixing frame 120, and each of the plurality of moving frames 140 can be individually moved.

The moving frames 140 can be moved in at least two directions (e.g., two axes or two axial directions).

As shown in FIG. 3, the moving frames 140 can be moved in two directions that intersect (e.g., cross each other) and are on (e.g., provided on) a plane that is parallel to the mask 200.

Referring to FIG. 3, the fixing frame 120 and the mask 200 can be rectangular, and the moving frames 140 installed in (e.g., mounted on) the fixing frame 120 can be moved in directions that are parallel to two neighboring sides of the fixing frame 120 or the mask 200, for instance, the x-axis direction and y-axis direction.

Therefore, the screen mask 10 moves the moving frames 140 individually, thereby precisely controlling (e.g., adjusting) the tension of the mask 200 supported by the frame 100.

When the number of moving frames 140 is increased, the tension can be more precisely controlled, and the number of moving frames 140 is variable according to the size of the mask 200 and/or of the fixing frame 120 and a required degree of control (e.g., control degree) of the tension supporting the mask 200.

For example, the mask 200 (e.g., rectangular mask) can be configured with at least one moving frame 140 for each side (e.g., each supported side) of the mask 200.

The respective moving frames 140 can be moved in at least two directions (e.g., two axes or two axial directions), and a detailed configuration of the moving frame 140 for realizing (e.g., controlling) the movement will be described.

Referring to FIG. 4, each of the plurality of moving frames 140 installed in the screen mask 10 can be configured into (e.g., configured as) a single unit so that they may be moved in two directions (e.g., two axial directions) individually.

Each moving frame 140 includes a first carriage 143 and a second carriage 145. Each moving frame 140 is configured to move on a first rail 141.

Here, the first rail 141 is formed on one side of the fixing frame 120, and it can form a straight (or substantially straight) guide rail.

The first rail 141 is installed in (e.g., mounted on or formed on) the fixing frame 120 in the x-axis direction with respect to FIG. 4.

The first rail 141 is formed in a direction that is parallel to one side of the mask 200 (e.g., rectangular mask).

The first carriage 143 can be moved along the first rail 141, a structure (e.g., a groove) that corresponds to the first rail 141 is formed on one side of the first carriage 143 so as to move along (e.g., interact with) the first rail 141, and a second rail 142 can be formed in a direction that is perpendicular to the first rail 141 on another side of the first carriage 143.

The second rail 142 can be formed as a straight (or substantially straight) guide rail at the top of the first carriage 143, and it can be formed in the y-axis direction that is perpendicular to the x-axis direction as shown in FIG. 4.

The second rail 142 can be formed in a direction that is parallel to another side of the mask 200 (e.g., rectangular mask) that neighbors the side of the mask 200 that is parallel to the first rail 141 that is described above.

The second carriage 145 can be moved along (e.g., interact with) the second rail 142 formed on the first carriage 143, and it can support one edge of the mask 200 (e.g., rectangular mask).

One edge of the mask 200 can be attached to the second carriage 145 through a known fastening apparatus or by a known fastening method, such as welding.

Each moving frame 140 includes the first carriage 143 that moves in the x-axis direction along the first rail 141 formed on the fixing frame 120 and the second carriage 145 that moves in the y-axis direction along the second rail 142 formed on the first carriage 143, so it can be moved in two directions (e.g., two axes or two axial directions), and the tension of the mask 200 supported by the moving frames 140 can be precisely controlled (e.g., adjusted).

Each moving frame 140 may include a ball screw and a linear guide.

The first rail 141 and the second rail 142 can be configured with (e.g., include or be formed as) the linear guide, and the first carriage 143 and the second carriage 145 can be configured to be movable by the ball screw.

The described ball screw and the linear guide can be automatically operated through a drive motor.

However, without being restricted to this, the operational configuration of the moving frame 140 is changeable in many ways, and, for instance, it can be configured to be manually operable.

As shown in FIG. 4, the first rail 141, the first carriage 143, the second rail 142, and the second carriage 145 can be sequentially disposed (e.g., sequentially located) in order from bottom to top.

Therefore, one side of the mask 200 can be moved in two directions (e.g., two axial directions) that are perpendicular to each other by using a simple configuration.

The screen mask 10 is configured such that the moving frames 140 supporting the mask 200 may be moved in at least two directions (e.g., two axes two or axial directions), thereby precisely controlling the tension that supports the mask 200.

Accordingly, the problem of unnecessarily reinstalling or exchanging the mask 200 after it is installed in the frame 100 because of lack of control of tension or position is prevented to save time and cost, and efficiency of the screen printing process is improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A screen mask for screen printing, the screen mask comprising:
    a mask; and
    a frame configured to support the mask with a tension, the frame comprising:
        a fixing frame; and
        a moving frame configured to support a single edge of the mask and movably mounted on the fixing frame,
    wherein the tension is controlled by the moving frame, and
    wherein the moving frame is movable in at least two directions with respect to the fixing frame, the at least two directions being perpendicular to each other.

2. The screen mask of claim 1, wherein the frame further comprises:
    a plurality of moving frames supporting the mask.

3. The screen mask of claim 2, wherein
    each of the plurality of moving frames is movable in two directions that are perpendicular to each other and on a plane that is parallel with the mask.

4. The screen mask of claim 3, wherein
    the mask has a rectangular shape, and
    each of the plurality of moving frames is movable in directions that are parallel to two adjacent edges of the mask.

5. A screen mask for screen printing, the screen mask comprising:
    a mask; and
    a frame configured to support the mask with a tension, the frame comprising:
        a fixing frame; and
        at least three moving frames, each of the moving frames supporting an edge of the mask and movably mounted on the fixing frame,
    wherein the tension is controlled by the plurality of moving frames, and
    wherein each of the moving frames is movable in at least two directions with respect to the fixing frame, the at least two directions being perpendicular to each other.

6. A screen mask for screen printing, the screen mask comprising:
    a mask; and
    a frame configured to support the mask with a tension, the frame comprising:
        a fixing frame; and
        a moving frame configured to support the mask and movably mounted on the fixing frame,
    wherein the tension is controlled by the moving frame,
    wherein the moving frame is movable in at least two direction that are perpendicular to each other, and
    wherein moving frame comprises:
        a first rail installed at the fixing frame;
        a first carriage movable along the first rail, and comprising a second rail perpendicular to the first rail; and
        a second carriage movable along the second rail and supporting one edge of the mask.

7. The screen mask of claim 6, wherein
    the first carriage is mounted on the first rail, and the second carriage is mounted on the second rail, the second rail being at a top of the first carriage.

8. The screen mask of claim 6, wherein
    the first carriage and the second carriage are moved by a ball screw.

9. The screen mask of claim 8, wherein
    the ball screw is configured to be driven by a driving motor.

10. The screen mask of claim 8, wherein
    the ball screw is configured to be driven manually.

* * * * *